United States Patent
Gao et al.

(10) Patent No.: US 7,156,951 B1
(45) Date of Patent: Jan. 2, 2007

(54) MULTIPLE ZONE GAS DISTRIBUTION APPARATUS FOR THERMAL CONTROL OF SEMICONDUCTOR WAFER

(75) Inventors: Qinghong K. Gao, Fremont, CA (US); Brian McMillin, Fremont, CA (US); Bill Denty, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 306 days.

(21) Appl. No.: 10/600,273

(22) Filed: Jun. 20, 2003

Related U.S. Application Data

(60) Provisional application No. 60/390,575, filed on Jun. 21, 2002.

(51) Int. Cl.
C23F 1/00 (2006.01)
H01L 21/306 (2006.01)
C23C 16/00 (2006.01)

(52) U.S. Cl. .................... 156/345.53; 118/724
(58) Field of Classification Search ............... 118/724; 156/345.53; 438/715
See application file for complete search history.

(56) References Cited

U.S. PATENT DOCUMENTS

| 5,320,982 | A | * | 6/1994 | Tsubone et al. | ............ 438/714 |
| 5,439,026 | A | * | 8/1995 | Moriya et al. | ............ 137/486 |
| 5,609,720 | A | * | 3/1997 | Lenz et al. | ............ 438/715 |
| 5,715,132 | A | | 2/1998 | Steger et al. | |
| 5,761,023 | A | * | 6/1998 | Lue et al. | ............ 361/234 |
| 5,835,334 | A | * | 11/1998 | McMillin et al. | ............ 361/234 |
| 5,937,541 | A | | 8/1999 | Weigand et al. | |
| 5,992,046 | A | | 11/1999 | Weigand et al. | |
| 6,015,595 | A | * | 1/2000 | Felts | ............ 427/446 |
| 6,245,192 | B1 | | 6/2001 | Dhindsa et al. | |
| 6,254,683 | B1 | * | 7/2001 | Matsuda et al. | ............ 118/500 |
| 6,320,736 | B1 | | 11/2001 | Shamouilian et al. | |
| 6,373,679 | B1 | | 4/2002 | Qiao et al. | |
| 2001/0052359 | A1 | * | 12/2001 | Ikeda | ............ 137/87.06 |

FOREIGN PATENT DOCUMENTS

JP 01251735 A * 10/1989
JP 10163308 A * 6/1998

* cited by examiner

*Primary Examiner*—Parviz Hassanzadeh
*Assistant Examiner*—Rakesh K Dhingra
(74) *Attorney, Agent, or Firm*—Buchanan Ingersoll & Rooney PC

(57) ABSTRACT

A gas distribution apparatus delivers a coolant gas, such as helium, to an upper surface of a chuck for controlling a temperature of a wafer placed on the chuck. The gas distribution apparatus allows first and second zones, such as an inner zone and an outer zone of the chuck, to be supplied with a coolant gas at different pressures for control of the temperature across the wafer. The gas distribution apparatus includes a pressure and flow control system for supplying the coolant gas at selected pressures and bleed lines which provide the dual function of allowing rapid evacuation of the inner and outer zones and preventing excess pressure from one zone from migrating to another zone.

30 Claims, 2 Drawing Sheets

MULTIPLE ZONE GAS DISTRIBUTION APPARATUS FOR THERMAL CONTROL OF SEMICONDUCTOR WAFER

RELATED APPLICATIONS

This application claims priority to U.S. Provisional Application 60/390,575 filed Jun. 21, 2002, which is hereby incorporated by reference in its entirety.

FIELD OF THE INVENTION

The invention relates to thermal control of a semiconductor wafer, and more particularly, the invention relates to a dual zone gas distribution apparatus and method for distribution of gas at a backside of a wafer.

DESCRIPTION OF THE RELATED ART

The fabricating and processing of semiconductor wafers to produce individual integrated circuits (IC's) is well known in the art. In one widely used manufacturing method a wafer (e.g., an eight inch diameter, silicon wafer) is chemically and photographically processed through a number of steps to produce a multitude of very closely spaced and precisely detailed IC's on the wafer. As part of its processing, a wafer may be exposed within a reactor to a highly active plasma of special gas or gases in order to etch, by means of reactive ions of the gases, very fine details (lines, zones, etc.) into a top surface of a wafer being processed. The wafer is subsequently cut into individual IC's.

A typical plasma etching apparatus comprises a reactor in which there is a chamber through which reactive gas or gases are flowed. Within the chamber the gases are ionized into a plasma, typically by radio frequency energy. The highly reactive ions of the plasma gas are able to react with material, such as a polymer mask on a surface of a semiconductor wafer being processed into IC's. Prior to etching, the wafer is placed in the chamber and held in proper position by a chuck or holder which exposes a top surface of the wafer to the plasma gas. There are several types of chucks (also sometimes called susceptors) known in the art. The chuck provides an isothermal surface and serves as a heat sink for the wafer. In one type, a semiconductor wafer is held in place by electrostatic force generated by an electric field between the chuck and wafer. The present invention is applicable to both mechanical and electrostatic types of chucks.

During etching in a typical plasma etching operation, the reactive ions of the plasma gas chemically react with portions of material on a face of the semiconductor wafer. Some processes are exothermic and cause some degree of heating of the wafer, but most of the heating is caused by the plasma. The chemical reaction between gas (ions and radicals) and wafer material, on the other hand, is accelerated to some degree by the temperature rise of the wafer. Local wafer temperature and rate of chemical reaction at each point on the wafer are interrelated such that harmful unevenness in etching of material over a face of the wafer can easily result if the temperature of the wafer across its area varies too much. In most cases it is highly desirable that etching be uniform to a nearly perfect degree otherwise the IC's fabricated will have electronic characteristics which deviate more than is desirable. Furthermore, with each new increase in the size of wafer diameter, going from four inch to six to eight and to twelve inch diameter wafers, the problem of insuring uniformity of each batch of IC's from larger and larger wafers becomes more difficult.

The problem of temperature rise of a wafer during reactive ion etching (RIE) is well known, and various attempts in the past to control the temperature of a wafer during etching have been tried. One previous way to control wafer temperature during RIE has been to admit coolant gas (such as helium) within a thin space between the bottom of the wafer and the top of the chuck which holds the wafer. However, past arrangements of this sort have not been entirely effective in adequately controlling temperature rises and variations in wafer temperature. This is particularly so with larger diameter wafers.

U.S. Pat. No. 5,609,720 describes an apparatus for improving control of the temperature of a semiconductor wafer by providing a plurality of zones of coolant gas at different pressures. For example, three concentrically arranged zones of coolant gas may be used with the highest pressure coolant gas at a center of the wafer to provide even temperature control across the wafer.

It is desirable to provide an apparatus for multiple zone gas distribution to a semiconductor wafer which allows rapid transition time between wafer processing steps. It is also desirable to provide a multiple zone gas distribution apparatus which allows accurate detection of dechucking of the wafer from the chuck.

SUMMARY OF THE INVENTION

The present invention relates to a dual zone gas distribution apparatus for distributing gas at separate pressures at a backside of a wafer.

In one embodiment, a multiple zone gas distribution apparatus for controlling temperature across a workpiece during processing comprises a chuck having a top face configured to hold a workpiece during processing, the chuck top face defining inner and outer zones between the top face of the chuck and the workpiece into which zone coolant gas may be admitted, inner and outer zone feed lines for feeding the coolant gas to the inner and outer zones of the chuck, a pressure and flow control system for supplying zone coolant gas to the feed lines with separate pressure for the inner and outer zones controlled to control the temperature across the workpiece, and inner and outer zone bleed lines connected to the inner and outer zone feed lines between the pressure and flow control system and the chuck, the inner zone bleed line having a fixed orifice for continuous bleeding of the pressure of the inner zone during processing of the workpiece, and the outer zone bleed line having a evacuation valve for pressure release.

In a further embodiment, an apparatus for detecting dechucking in a multiple zone wafer cooling system comprises a chuck having a top face configured to hold a workpiece during processing, the chuck top face defining inner and outer zones between the top face of the chuck and the workpiece into which zone coolant gas may be admitted, first and second zone feed lines for feeding the coolant gas to the inner and outer zones of the chuck, a pressure and flow control system for supplying zone coolant gas to the feed lines with separate pressure for the first and second zones controlled to control the temperature across the workpiece, and first and second zone bleed lines connected to the first and second zone feed lines between the pressure and flow control system and the chuck, the first zone bleed line having a fixed orifice for continuous bleeding of the pressure of the first zone during processing of the workpiece. The pressure and flow control system for supplying coolant gas to the second zone feed line provides a signal indicating dechucking when the flow rate increases more than a predetermined amount.

In another embodiment, a method of distributing cooling gas to a backside of a workpiece in a semiconductor processing chamber comprises holding a workpiece on a top face of a chuck, the chuck top face defining inner and outer zones between the top face of the chuck and the workpiece into which zone coolant gas may be admitted, supplying zone coolant gas to the inner and outer zones, controlling the pressures of the zone coolant gas to maintain separate pressures for the inner and outer zones to control the temperature across the workpiece, and continuously bleeding of the inner zone coolant gas through an inner zone bleed line orifice during processing of the workpiece, and bypassing the inner zone bleed line orifice to evacuate the inner zone coolant.

In another embodiment, a method of detecting dechucking in a multiple zone wafer cooling system comprises holding a workpiece on a top face of a chuck, the chuck top face defining first and second zones between the top face of the chuck and the workpiece into which zone coolant gas may be admitted, supplying zone coolant gas to the first and second zones, controlling the pressures of the zone coolant gas to maintain separate pressures for the first and second zones to control the temperature across the workpiece, and continuously bleeding the first zone coolant gas through an inner zone bleed line orifice during processing of the workpiece, and detecting dechucking by sensing when a flow rate of zone coolant gas to the second zone increases more than a predetermined amount.

BRIEF DESCRIPTION OF THE DRAWING FIGURES

The invention will now be described in greater detail with reference to the preferred embodiments illustrated in the accompanying drawings, in which like elements bear like reference numerals, and wherein.

DETAILED DESCRIPTION OF THE INVENTION

Figure 1:
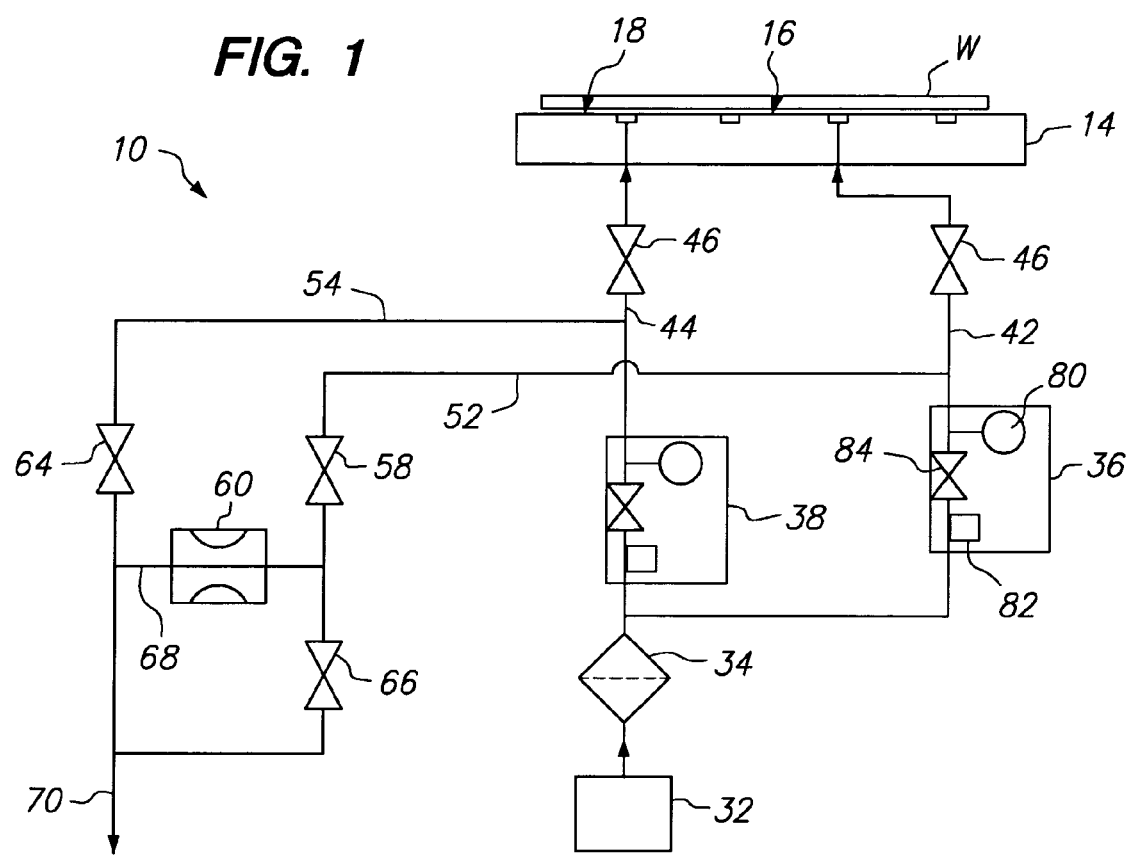
FIG. 1 is schematic view of the gas distribution apparatus.

FIG. 1 illustrates a gas distribution apparatus for delivery of a coolant gas, such as helium, to an upper surface of a chuck 14 for controlling a temperature of a wafer W placed on the chuck. The gas distribution apparatus allows first and second zones, such as an inner zone 16 and an outer zone 18 of the chuck 14 to be supplied with a coolant gas at different pressures for control of the temperature across the wafer W. The gas distribution apparatus 10 includes a pressure and flow control system for supplying the coolant gas at selected pressures and bleed lines which provide the dual function of allowing rapid evacuation of the inner and outer zones and preventing excess pressure from one zone from migrating to another zone.

Figure 2:
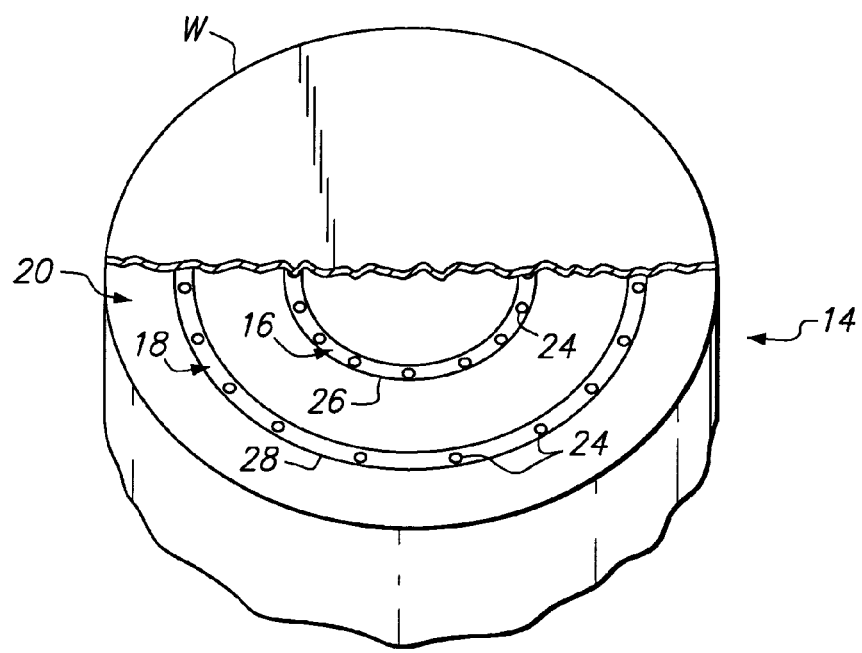
FIG. 2 is a schematic perspective view of a chuck and wafer with the wafer partially broken away to show details of the top face of the chuck.

As illustrated in FIG. 2, an enlarged schematic perspective view of the chuck 14, the chuck top face 20 has two sets of small circular holes 24 arranged in a circular pattern and positioned within shallow grooves 26, 28 in the top face of the chuck. The grooves 26, 28 provide for easy circumferential flow of zone coolant gas beneath the wafer W and along the top face 20 of the chuck 14 in each of the zones 16, 18. Zone coolant gas passes from the holes 24 up into the shallow grooves 26, 28 and beneath the wafer W. The coolant gas may be exhausted down through the holes 24. By providing the multiple zones 16, 18 of coolant gas delivery, the temperature of the wafer W across its area from the center to the rim of the wafer is effectively controlled. Although two coolant zones 16, 18 have been illustrated, other numbers of concentric coolant zones may also be used. Further, coolant zones of other shapes may also be used.

With respect to FIG. 1, the gas distribution apparatus 10 is provided with a coolant gas source 32 from which the coolant may optionally pass through a filter 34 to a pressure and flow control system which includes an inner zone pressure and flow control system 36 and an outer zone pressure and flow control system 38. The control systems 36, 38 deliver the coolant via inner and outer feed lines 42, 44 to the inner and outer zones 16, 18 of the chuck 14. Isolation valves 46 are provided in the inner and outer feed lines 42, 44 to allow isolation of the gas distribution apparatus 10 upon removal of the wafer W from the chuck 14.

Inner and outer bleed lines 52, 54 are connected to the inner and outer zone feed lines 42, 44 for the purpose of relieving excess pressure from the inner and outer zones 16, 18 and/or for evacuating the inner and outer zones. The inner bleed line 52 is provided with an optional inner zone ballast valve 58 which is generally left open to allow coolant to continuously pass to a fixed orifice 60. The fixed orifice 60 allows for continuous bleeding of the pressure at the inner zone 16 of the chuck 14 during processing of the wafer W and prevents excess pressure from the inner zone from migrating into the outer zone 18.

The fixed orifice 60 for allowing continuous bleeding of the inner zone bleed line 52 has a diameter which is selected to substantially prevent high pressure coolant gas from the inner zone 16 from migrating to the outer zone 18 while being small enough to prevent a loss of pressurization of the inner zone. For example, the fixed orifice 60 may have a diameter of about 0.03 inches to about 0.15 inches, preferably the orifice has a diameter of about 0.08 inches or less. The fixed orifice is positioned along a line 68 which connects the inner zone bleed line 52 to a coolant exhaust 70. Although a fixed orifice 60 has been shown and described, an adjustable orifice may also be used if set to an appropriate opening size to provide continuous pressure release from the inner zone.

In order to evacuate the inner zone 16, the inner zone bleed line 52 is provided with an inner zone evacuation valve 66 which is positioned in parallel with the fixed orifice 60 and allows the coolant gas from the inner zone to bypass the fixed orifice 60 and be delivered directly to the coolant exhaust 70 when evacuation of the inner zone 16 is desired.

The outer zone bleed line 54 is provided with an evacuation valve 64 which is normally closed during processing and is opened for evacuation of the coolant gas from the outer zone 18. The outer zone 18, due to its position at an exterior of the wafer W and chuck 14, can bleed between the wafer and chuck into the surrounding chamber during processing. Thus, continuous bleeding of the outer zone 18 by the outer bleed line 54 is not required.

Figure 3:
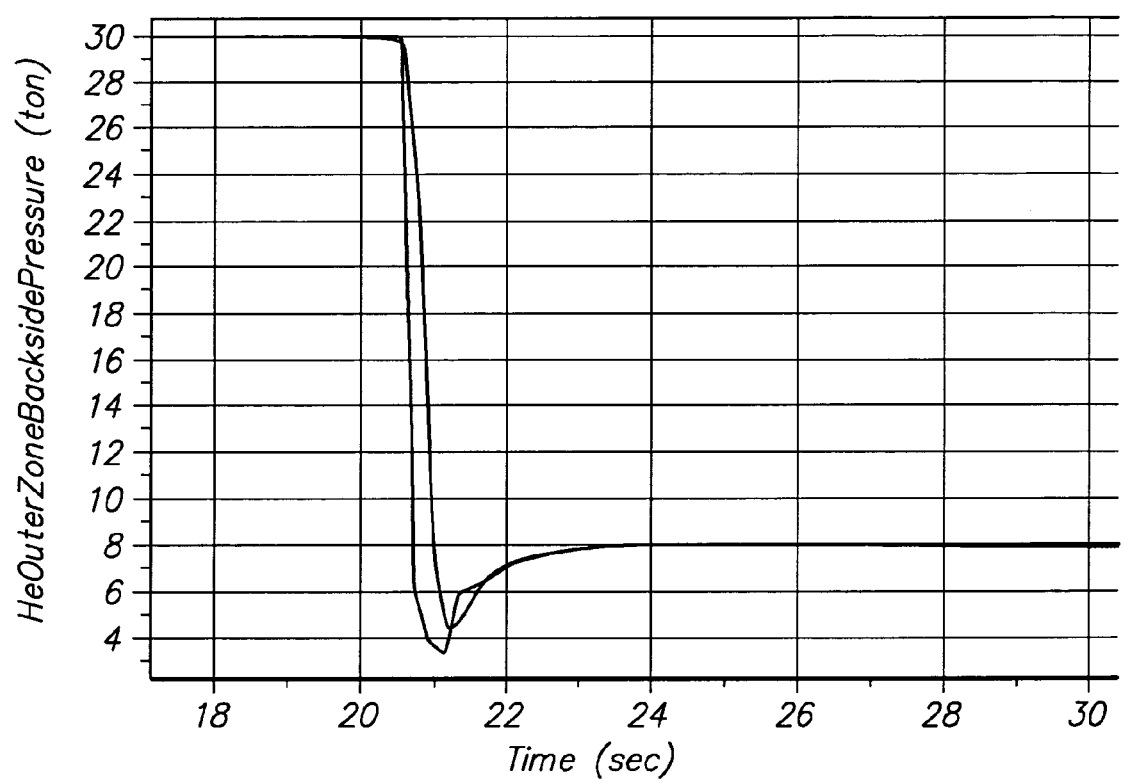
FIG. 3 is a graph showing transition time for evacuating the gas distribution apparatus.

In providing the evacuation valves 64, 66 the gas distribution apparatus 10 is capable of being evacuated very quickly to allow removal of the wafer W from the chuck 14. Quick evacuation is important to improve throughput by reducing the transition time for evacuating the gas distribution apparatus. As shown in FIG. 3, the helium backside pressure between the chuck 14 and the wafer W drops from a pressure of about 30 torr to a pressure of about 8 torr in less than 3 seconds. This transition time is significantly better than the about 8 to 10 second transition time of the known systems.

The inner and outer zone control systems 36, 38 may each be formed as an integrated system including a pressure sensor 80, a controller 82, and a flow control valve 84. Alternatively, the pressure and flow control systems 36 and 38 may include an independent pressure sensor and flow controller.

According to one embodiment of the invention, the outer zone control system 38 also provides a sensing system for sensing dechucking of the wafer W from the chuck 14. Dechucking of the wafer W is sensed when a sudden pressure drop in the outer zone 18 is sensed by the outer control system 38. The ability to sense dechucking with the outer control system 38 is significantly improved by the use of the fixed orifice 60. The fixed orifice 60 allows continuous bleeding of the inner zone 16 and prevents migration of excess pressure from the inner zone to the outer zone 18 which may distort any possible sudden pressure change which would indicate dechucking. A small amount of coolant gas from the outer zone 18 continuously bleeds between the wafer W and the chuck 14 radially outwardly into the surrounding chamber. When dechucking occurs the amount of coolant gas bleeding into the chamber between the wafer W and the chuck 14 suddenly increases because the gap between the wafer and the chuck has increased. This results in a corresponding sudden decrease in the pressure at the outer zone 18 which can be sensed by the control system 38 and can very accurately indicate when dechucking has occurred. This accurate indication of dechucking is important to prevent damage to wafers which occurs when wafers are lifted prior to complete dechucking. The accurate indication of dechucking also assists in increasing throughput because the wafers can be lifted immediately upon indication of dechucking without waiting an additional time period to ensure that dechucking is complete.

Although the present invention has been described for use in processing a semiconductor wafer in a semiconductor wafer processing chamber, it should be understood that the invention may also be useful for delivering a coolant gas to other work pieces.

EXAMPLE

The following is one example of a method for cooling a wafer using the multiple zone gas distribution apparatus 10 of FIG. 1.

A wafer W is placed onto the chuck 14 for processing and the isolation valves 46 and ballast valve 58 are set to their normally open position for delivery of coolant to the back side of the semiconductor wafer. The inner and outer pressure and flow control systems 36, 38 deliver coolant gas from the coolant gas supply 32 to the back side of the semiconductor wafer at different pressures. For example, the inner zone 16 may be set at a high pressure while the outer zone 18 is set at a lower pressure. After one or more processing steps have been performed on the wafer W it may be desirable to change the inner and outer zones 16, 18 to different pressures for one or more additional processing steps. A quick increase in pressure of one or more of the zones is controlled by the inner and outer control systems 36, 38, while a quick decrease in pressure is controlled by the control systems in combination with the evacuation valves 64, 66. For the second one or more processing steps the outer zone 18 may be set at a high pressure and the inner zone 16 may be set at a low pressure. The particular pressures, sequences of pressures used, and durations of pressures used all depend on the particular processing steps which are performed on the wafer. Upon completion of wafer processing, the back side coolant gas is evacuated quickly by opening the evacuation valves 64, 66.

Sensing the pressure in the outer zone 18 with the control system 38 may be used as an indication of dechucking of the wafer. Upon dechucking of the wafer the isolation valves 46 and the optional ballast valve 58 are closed to isolate the gas distribution apparatus 10 during removal of the wafer W and delivery of a next wafer to the chuck 14.

While the invention has been described in detail with reference to the preferred embodiments thereof, it will be apparent to one skilled in the art that various changes and modifications can be made and equivalents employed, without departing from the present invention.

What is claimed is:

1. A multiple zone gas distribution apparatus for controlling temperature across a workpiece during processing, the apparatus comprising:
    a chuck having a top face configured to hold a workpiece during processing, the chuck top face defining inner and outer zones between the top face of the chuck and the workpiece into which zone coolant gas may be admitted;
    inner and outer zone feed lines adapted to feed the coolant gas to the inner and outer zones of the chuck;
    a pressure and flow control system adapted to supply zone coolant gas to the feed lines with separate pressure for the inner and outer zones controlled to control the temperature across the workpiece; and
    inner and outer zone bleed lines connected to the respective inner and outer zone feed lines respectively between the pressure and flow control system and the chuck, the inner zone bleed line having a connecting line in fluid connection with the outer zone bleed line and a fixed orifice adapted to continuously bleed the pressure of the inner zone to the outer zone bleed line during processing of the workpiece, the inner zone bleed line having an evacuation valve which is adapted to bypass the fixed orifice for immediate inner zone evacuation, and the outer zone bleed line having an evacuation valve for pressure release, which is located upstream of the inner zone connecting line.

2. The apparatus of claim 1, wherein the outer zone bleed line evacuation valve is adapted to be closed during processing of the workpiece and the outer zone pressure bleeds between the chuck and the workpiece to the surrounding chamber.

3. The apparatus of claim 1, wherein the inner and outer zones are concentric circular zones.

4. The apparatus of claim 1, wherein the inner and outer zones of the chuck top face each include a plurality of holes arranged in circular pattern for delivery of coolant gas.

5. The apparatus of claim 4, wherein the inner and outer zones of the chuck top face include at least one shallow circular groove to provide flow of coolant gas from the plurality of holes in a circular direction along the underside of the workpiece.

6. The apparatus of claim 1, wherein the pressure and flow control system is adapted to control the supply of zone coolant gas to the feed lines to achieve different pressures in the inner and outer zones throughout the processing of a workpiece to control the temperature across the workpiece.

7. The apparatus of claim 1, wherein the inner and outer evacuation valves allow evacuation of the inner and outer zones in 5 seconds or less.

8. An apparatus for detecting dechucking in a multiple zone wafer cooling system, the apparatus comprising:
   a chuck having a top face configured to hold a workpiece during processing, the chuck top face defining first and second zones between the top face of the chuck and the workpiece into which zone coolant gas may be admitted;
   first and second zone feed lines adapted to feed the coolant gas to the first and second zones of the chuck;
   a pressure and flow control system adapted to supply coolant gas to the feed lines with separate pressure for the first and second zones controlled to control the temperature across the workpiece; and
   first and second zone bleed lines connected to the respective first and second zone feed lines respectively between the pressure and flow control system and the chuck, the first zone bleed line having a connecting line in fluid connection with the second zone bleed line and a fixed orifice adapted to continuously bleed the pressure of the first zone to the second zone bleed line during processing of the workpiece, the first zone bleed line having an evacuation valve which is adapted to bypass the fixed orifice for immediate first zone evacuation; and
   the second zone bleed line having an evacuation valve for pressure release, which is located upstream of the first zone connecting line; and
   wherein the pressure and flow control system provides a signal indicating dechucking when the flow rate of the coolant gas increases more than a predetermined amount.

9. The apparatus of claim 8, wherein the first and second zones are concentric zones.

10. The apparatus of claim 9, wherein the first zone is an inner concentric zone and the second zone is an outer concentric zone.

11. The apparatus of claim 8, wherein the second zone bleed line includes an evacuation valve which is adapted to be closed during processing of the workpiece such that the second zone pressure bleeds between the chuck and the workpiece to the surrounding chamber.

12. A method of controlling temperature across a workpiece during processing using the apparatus according to claim 1, the method comprising:
   holding a workpiece on the top face of the chuck;
   feeding zone coolant gas to the inner and outer zones via the inner and outer zone feed lines, respectively;
   controlling the pressures of the zone coolant gas with the pressure and flow control system to maintain separate pressures for the inner and outer zones to control the temperature across the workpiece;
   continuously bleeding of the inner zone coolant gas through the inner zone bleed line orifice during processing of the workpiece; and
   evacuating the inner zone coolant gas from the inner zone by bypassing the inner zone bleed line orifice.

13. The method of claim 12, further comprising evacuating the outer zone coolant gas from the outer zone through the outer zone bleed line by opening an outer zone evacuation valve.

14. The method of claim 12, further comprising bleeding the outer zone coolant gas between the chuck and the workpiece into a surrounding chamber.

15. The method of claim 12, wherein the inner zone coolant gas is evacuated from the inner zone to allow removal of the workpiece from the chuck in a transition time of 5 seconds or less.

16. The method of claim 12, wherein the continuous bleeding of the inner zone coolant prevents excess pressure from the inner zone from migrating into the outer zone.

17. A method of detecting dechucking in a multiple zone wafer cooling system using the apparatus according to claim 8, the method comprising:
   holding a workpiece on the top face of the chuck;
   feeding zone coolant gas to the first and second zones via the first and second zone feed lines, respectively;
   controlling the pressures of the zone coolant gas with the pressure and flow control system to maintain separate pressures for the first and second zones to control the temperature across the workpiece;
   continuously bleeding the first zone coolant gas through the first zone bleed line orifice during processing of the workpiece; and
   detecting dechucking by sensing when a flow rate of zone coolant gas to the second zone increases more than a predetermined amount.

18. The method of claim 17, wherein the first zone is an inner zone and the second zone is an outer zone concentrically surrounding the inner zone.

19. The method of claim 17, further comprising evacuating the second zone coolant gas through a second zone bleed line by opening a second zone evacuation valve.

20. The method of claim 17, wherein the first and second zone coolant gas is evacuated from the first and second zones to allow removal of the workpiece from the chuck in a transition time of 5 seconds or less.

21. The apparatus of claim 1, wherein the fixed orifice is positioned along the connecting line.

22. The apparatus of claim 21, wherein the inner zone bleed line is adapted to be bled via the connecting line and the outer zone bleed line.

23. The apparatus of claim 8, wherein the fixed orifice is positioned along the connecting line.

24. The apparatus of claim 23, wherein the first zone bleed line is adapted to be bled via the connecting line and the second zone bleed line.

25. The apparatus of claim 1, wherein the chuck is surrounded by a semiconductor wafer processing chamber for processing a semiconductor wafer held on the top face of the chuck.

26. The apparatus of claim 25, wherein the processing chamber is a plasma etching chamber.

27. The apparatus of claim 8, wherein the chuck is surrounded by a semiconductor wafer processing chamber for processing a semiconductor wafer held on the top face of the chuck.

28. The apparatus of claim 27, wherein the processing chamber is a plasma etching chamber.

29. The method of claim 12, wherein the workpiece is a semiconductor wafer held on the top face of the chuck during processing, the chuck is surrounded by a semiconductor wafer processing chamber.

30. The apparatus of claim 29, wherein the processing chamber is a plasma etching chamber.

* * * * *